US009822448B2

(12) United States Patent
Park et al.

(10) Patent No.: US 9,822,448 B2
(45) Date of Patent: Nov. 21, 2017

(54) IN SITU SYSTEM AND METHOD OF MANUFACTURING NANOPARTICLES HAVING CORE-SHELL STRUCTURE

(71) Applicant: Daejin University Center for Educational Industrial Cooperation, Pocheon-si, Gyeonggi-do (KR)

(72) Inventors: Sungho Park, Goyang-si (KR); Won-Seok Chae, Pocheon-si (KR); Man So Han, Seosan-si (KR)

(73) Assignee: Daejin University Center for Educational Industrial Cooperation, Pocheon-si, Gyeonggi-do (KR)

( * ) Notice: Subject to any disclaimer, the term of this patent is extended or adjusted under 35 U.S.C. 154(b) by 147 days.

(21) Appl. No.: 14/487,109

(22) Filed: Sep. 16, 2014

(65) Prior Publication Data

US 2015/0079310 A1    Mar. 19, 2015

(30) Foreign Application Priority Data

Sep. 16, 2013   (KR) ........................ 10-2013-0110862

(51) Int. Cl.
| | |
|---|---|
| *C23C 16/54* | (2006.01) |
| *C23C 16/56* | (2006.01) |
| *B82Y 40/00* | (2011.01) |
| *C23C 16/455* | (2006.01) |
| *C23C 16/40* | (2006.01) |
| *C23C 16/44* | (2006.01) |

(52) U.S. Cl.
CPC ........ *C23C 16/45555* (2013.01); *B82Y 40/00* (2013.01); *C23C 16/403* (2013.01); *C23C 16/4417* (2013.01); *C23C 16/54* (2013.01); *C23C 16/56* (2013.01)

(58) Field of Classification Search
None
See application file for complete search history.

(56) References Cited

U.S. PATENT DOCUMENTS

| | | | | |
|---|---|---|---|---|
| 5,201,956 | A | * | 4/1993 | Humphrey .............. C23C 16/44 118/500 |
| 6,734,020 | B2 | * | 5/2004 | Lu ........................ G05D 11/133 436/55 |
| 6,994,837 | B2 | * | 2/2006 | Boulos ................... B01J 19/088 423/608 |
| 9,732,435 | B2 | * | 8/2017 | Hayashi ................. C30B 7/105 |

(Continued)

FOREIGN PATENT DOCUMENTS

KR        10-1247968 B1    4/2013

OTHER PUBLICATIONS

Scientific Treatise "Nano Technology Development Trend: Core-Shell Nanoparticle" Korean Journal of Industrial and Engineering Chemistry, vol. 12, No. 3, pp. 23-37, 2009.

*Primary Examiner* — Karla Moore
(74) *Attorney, Agent, or Firm* — Revolution IP, PLLC

(57) ABSTRACT

Disclosed is a nanoparticle generating unit, a nanoparticle coating unit, and a core-shell nanoparticle collecting unit are connected to link and continuously process generation of nanoparticles and a coating and collecting process. The nanoparticle coating unit is formed of a porous material or in a grid structure and a moving speed of the nanoparticles can be decreased using a speed adjustment member installed at a process passage of a coating chamber.

7 Claims, 3 Drawing Sheets

(56) References Cited

U.S. PATENT DOCUMENTS

2005/0074392 A1* 4/2005 Yang .................... B82Y 30/00
423/447.3
2010/0261058 A1* 10/2010 Lopatin ................ H01M 4/133
429/212
2011/0200822 A1* 8/2011 Detavernier ........ C23C 16/4417
428/402

* cited by examiner

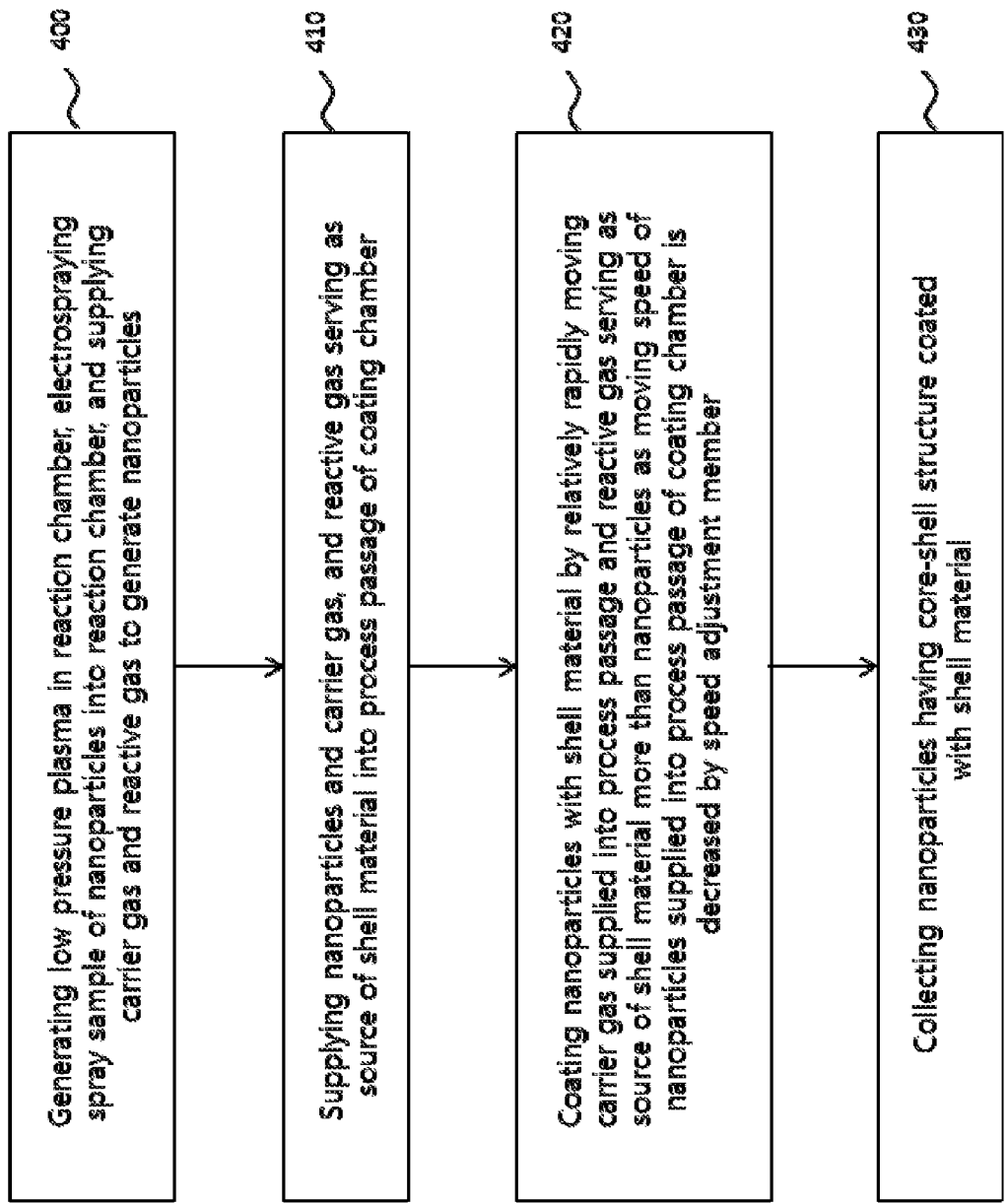

IN SITU SYSTEM AND METHOD OF MANUFACTURING NANOPARTICLES HAVING CORE-SHELL STRUCTURE

CROSS-REFERENCE TO RELATED APPLICATION

This application claims priority to and the benefit of Korean Patent Application No. 2013-0110862, filed on Sep. 16, 2013, the disclosure of which is incorporated herein by reference in its entirety.

BACKGROUND

1. Field of the Invention

The present invention relates to a nanoparticle manufacturing technology of a core-shell structure, and more particularly, to an in situ system and method of manufacturing nanoparticles having a core-shell structure capable of collecting nanoparticles coated with a shell material after a reactive gas supplied into a process passage of a coating chamber as a source of the shell material overtakes foregoing nanoparticles and is processed in a coating process through a multi-step collecting process at a high yield, and manufacturing high purity nanoparticles uniform and appropriate for mass production through continuous processing related to generation of nanoparticles and a coating and collecting process.

2. Discussion of Related Art

Nanoparticles are a core material needed for commercializing technologies in various fields including those of biosensors, fluorescent substances of next generation displays, solar cells, and nano electronic devices.

Among these, core-shell nanoparticles have a structure in which a shell-forming material surrounds a core material disposed at a center thereof, and properties and development trends of the core-shell nanoparticles are disclosed in Non-Patent Literature 1. For example, the nanoparticles having the core-shell structure are different from a simple mixture or an alloy of at least two materials. Since nano materials having complex functions representing at least two properties can be provided according to which material having a certain property is used for each of a core and a shell, research on the nanoparticles having the core-shell structure by various combinations of metal-metal, metal-ceramic, metal-organic matter, and organic matter-organic matter structures have been accomplished. It is being shown that the nanoparticles having the core-shell structure can be easily applied in various fields due to complex functions obtained by combining properties such as a magnetic property, a fluorescent property, acid resistance, wear resistance, and so on.

Meanwhile, various methods for manufacturing nanoparticles having a core-shell structure have been proposed, and for example, Patent Literature 1 discloses a technology that can be operated in different pressure ranges and that can control a thickness coated on core particles in a low pressure particle coating process in real time by installing a pressure separating means between a core material manufacturer and a particle coating reactor.

However, the related art including the related documents has a problem that the sizes of the generated nanoparticles are irregular because the nanoparticles having the core-shell structure are still developed on a laboratory level, and the particle size is increased and becomes irregular because time elapses in a state in which the reaction on the surfaces of the generated nanoparticles is not completely terminated.

Accordingly, process equipment and a manufacturing method that are capable of manufacturing high purity nanoparticles having high uniformity by reducing deviation between particles, collecting the particles at high yield to be appropriate for mass production, and improving productivity are acutely needed.

In addition, since a thickness of the shell material coated on the nanoparticles can be easily and simply adjusted, reduction in cost due to implementing of process equipment and stabilization of the manufacturing process should be attempted.

CITATION LIST

Patent Literature (Patent Literature 1) [Patent Literature 1] Korean Patent Registration No. 10-1247968 (Published on Apr. 3, 2013)

Non-Patent Literature (Non-Patent Literature 1) [Non-Patent Literature 1] Scientific Treatise "Nano Technology Development Trend: Core-Shell Nanoparticle" *Korean Journal of Industrial and Engineering Chemistry*, Volume 12, No. 3, Pages 23-37, 2009.

SUMMARY OF THE INVENTION

The present invention is directed to provide an in situ system and method of manufacturing nanoparticles having a core-shell structure that are capable of mass production of high purity nanoparticles having small deviation between particles.

The present invention is also directed to provide an in situ system and method of manufacturing nanoparticles having a core-shell structure that are capable of easily adjusting a thickness of a shell material coated on the nanoparticles.

According to an aspect of the present invention, there is provided an in situ system of manufacturing nanoparticles having a core-shell structure, the system including a nanoparticle generating unit configured to generate the nanoparticles in a reaction chamber; a nanoparticle coating unit configured to receive the nanoparticles serving as a core material from a process passage of a coating chamber connected to the nanoparticle generating unit, supply a carrier gas and a reactive gas serving as a source of a shell material into the process passage of the coating chamber, and coat the nanoparticles moving in the process passage of the coating chamber with the shell material in a state in which a vacuum pump is operated; and a core-shell nanoparticle collecting unit configured to collect the nanoparticles having the core-shell structure coated with the shell material in the nanoparticle coating unit, wherein the units are connected to link and continuously process generation of the nanoparticles and a coating and collecting process performed by the nanoparticle generating unit, the nanoparticle coating unit, and the core-shell nanoparticle collecting unit, and the nanoparticle coating unit has a speed adjustment member installed in the process passage of the coating chamber such that a moving speed of the nanoparticles is decreased and the reactive gas moves to overtake the foregoing nanoparticles.

In addition, the speed adjustment member may be formed of a porous material or in a grid structure.

Further, a plurality of speed adjustment members may be installed in a longitudinal direction of the process passage at predetermined intervals, and the moving speed of the nanoparticles may be decreased due to flow resistance or collision when the nanoparticles pass through the speed adjustment member.

Furthermore, a supply period of the reactive gas may be set to correspond to a coating thickness of the shell material coated on the nanoparticles.

In addition, a first precursor and a second precursor may be alternately supplied as the reactive gas, and a discharge time for discharging a reactant or byproduct generated in the coating chamber may be set whenever one of the first and second precursors is supplied.

Further, the carrier gas may be argon (Ar) serving as an inert gas, and TMA (trimethylaluminum) serving as an aluminum source and $H_2O$ serving as an oxygen source may be used as the reactive gas when an aluminum oxide ($Al_2O_3$) thin film is coated as the shell material.

Furthermore, the nanoparticle generating unit may include a fluid supply pump configured to supply a precursor in a liquid phase serving as a spray sample of the nanoparticles, a gas supply source configured to supply the carrier gas and the reactive gas, and a low temperature plasma generator configured to generate low temperature plasma according to a radio frequency inductively coupled plasma (ICP) method.

In addition, the low temperature plasma generator may include an RF matching box configured to match impedance of the reaction chamber using a direct current high voltage supply unit, an electrospray nozzle, and a radio frequency.

Further, the core-shell nanoparticle collecting unit may include at least one of a cyclone collector, an electrostatic collector, and a particle collector.

Furthermore, the electrostatic collector may include an electrode member constituted by a high voltage electrode installed at a collecting container and a ground electrode, and an alternating current high voltage supply unit configured to supply an alternating current high voltage to the high voltage electrode, and the ground electrode may include a plurality of disk-shaped conductive plates installed in an axial direction of a support section, and a periphery of the conductive plate has a sharp serration shape.

In addition, the particle collector may include a separating container connected to the electrostatic collector, a storage container installed to be in communication with the separating container and configured to finally collect and store the core-shell nanoparticles, and a plurality of grids installed in the separating container to guide the nanoparticles having the core-shell structure to the storage container.

According to another aspect of the present invention, there is provided an in situ method of manufacturing nanoparticles having a core-shell structure, the method including: generating low pressure plasma in a reaction chamber, electrospraying a spray sample of nanoparticles into the reaction chamber, and supplying a carrier gas and a reactive gas to generate nanoparticles; supplying the nanoparticles and the carrier gas, and the reactive gas serving as a source of a shell material into a process passage of a coating chamber; coating the nanoparticles with the shell material by relatively rapidly moving the carrier gas supplied into the process passage and the reactive gas serving as the source of the shell material more than the nanoparticles as a moving speed of the nanoparticles supplied into the process passage of the coating chamber is decreased by a speed adjustment member; and collecting the nanoparticles having the core-shell structure coated with the shell material.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which:

FIG. 4 is a flowchart for describing an in situ method of manufacturing nanoparticles having a core-shell structure according to an embodiment of the present invention.

DETAILED DESCRIPTION OF EXEMPLARY EMBODIMENTS

Hereinafter, an embodiment of the present invention will be described in detail with reference to the accompanying drawings.

Figure 1:
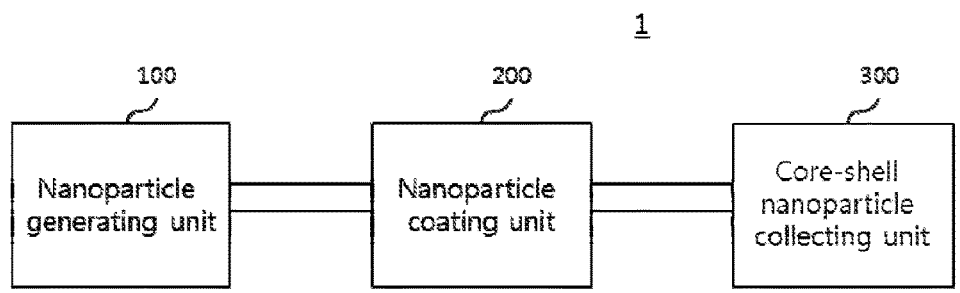
FIG. 1 is a block diagram of an in situ system of manufacturing nanoparticles having a core-shell structure according to an embodiment of the present invention.

As shown in FIG. 1, an in situ system 1 for manufacturing nanoparticles having a core-shell structure according to an embodiment of the present invention includes a nanoparticle generating unit 100 configured to generate nanoparticles in a reaction chamber using low pressure plasma, a nanoparticle coating unit 200 configured to supply nanoparticles and a reactive gas serving as a source of a shell material into a coating chamber and coat the shell material on surfaces of the nanoparticles, and a core-shell nanoparticle collecting unit 300 configured to collect the nanoparticles having the core-shell structure coated with the shell material.

The nanoparticle generating unit 100, the nanoparticle coating unit 200, and the core-shell nanoparticle collecting unit 300 are connected to link processes and continuously process the processes. In the embodiment, while a method of generating nanoparticles through a radio frequency inductively coupled plasma (ICP) method by the nanoparticle generating unit 100 is exemplified, generation of the nanoparticles is not limited to a specific method.

Figure 2:
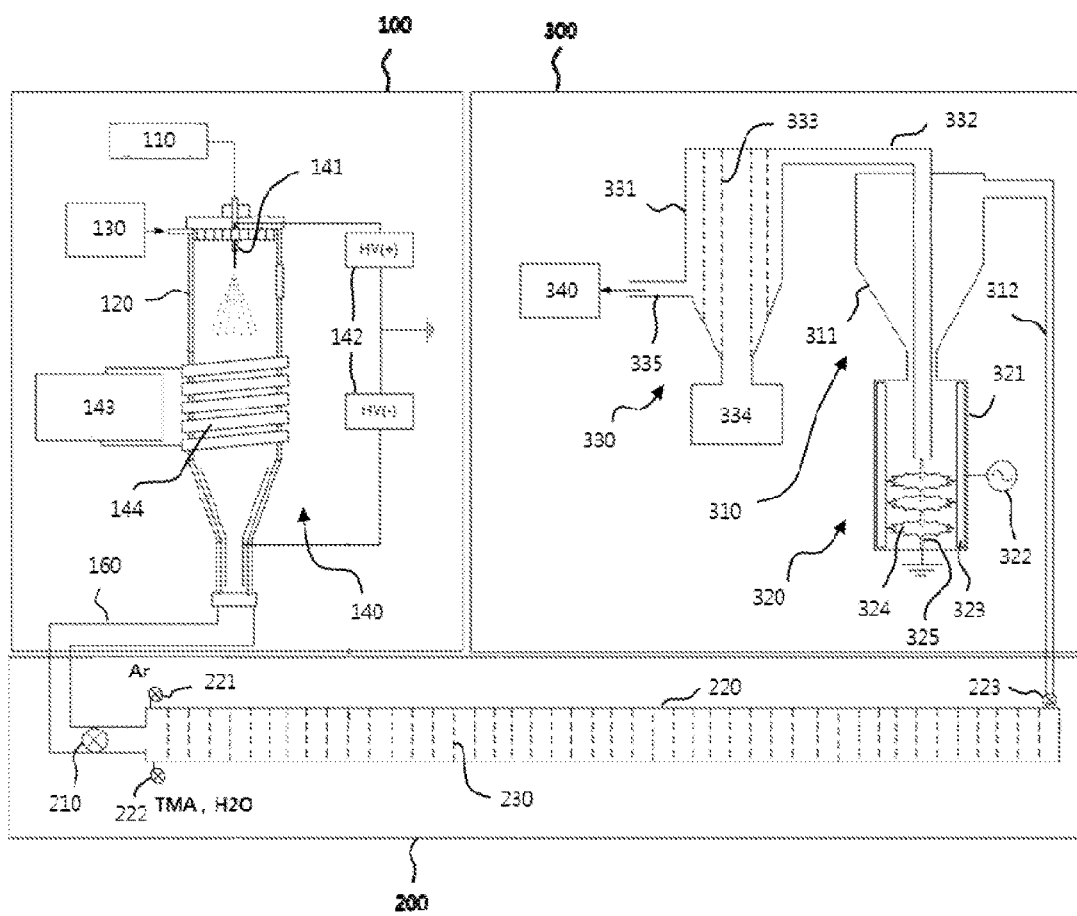
FIG. 2 is a configuration view of the in situ system of manufacturing the nanoparticles having the core-shell structure according to the embodiment of the present invention.

Referring to FIG. 2, the nanoparticle generating unit 100 includes a fluid supply pump 110, a reaction chamber 120, a gas supply source 130, and a low pressure plasma generator 140.

The fluid supply pump 110 supplies a precursor in a liquid phase serving as a spray sample of nanoparticles. Here, the precursor in the liquid phase can be appropriately selected according to a kind of nanoparticles serving as a core material. The fluid supply pump 110 can supply the precursor in the liquid phase into an electrospray nozzle 141 installed at one side of the reaction chamber 120 to perform an electrospray process.

The electrospray nozzle 141 sprays the precursor in the liquid phase into the reaction chamber 120, and the gas supply source 130 supplies a carrier gas and a reactive gas into the reaction chamber 120. Here, Ar may be used as the carrier gas, and $O_2$, $NH_3$, $H_2O$, and so on may be used as the reactive gas.

The low pressure plasma generator 140 includes a direct current high voltage supply unit 142 configured to supply a direct current high voltage between the electrospray nozzle 141 and a lower end of the reaction chamber 120 to generate low pressure plasma in the reaction chamber 120, and an RF matching box 143 configured to match impedance of the reaction chamber 120 using a radio frequency generated in an induction coil 144 surrounding the reaction chamber 120.

The precursor melted in a liquid solvent by a high voltage applied to the reaction chamber 120 forms nano drops to be sprayed in the reaction chamber 120. Here, as the low pressure plasma (cold plasma) is generated in the reaction chamber 120 by the low pressure plasma generator 140, the carrier gas (Ar) and the reactive gas ($O_2$, $NH_3$, $H_2O$, and so on) supplied from the gas supply source 130 are activated to generate a reactive radical, and the reactive radical reacts with the nano drops to generate nanoparticles. The nanoparticles may be a metal oxide, a metal nitride, or the like. Here, the solvent serving as a medium of the nano drops is vaporized by the plasma to first exit the reaction chamber 120. Here, the reason for generating the low pressure plasma in the reaction chamber 120 is that sufficient reaction energy can be supplied to the nano drops even at a low temperature and mass production of the nanoparticles in an inert gas or vacuum state becomes easy.

The generated nanoparticles are conveyed to the nanoparticle coating unit 200 via a connecting pipe 160, and supplied into a coating chamber 220 through a valve 210 installed at the connecting pipe 160.

The nanoparticle coating unit 200 may coat the shell material through atomic layer deposition. The atomic layer deposition can perform thin film deposition of a nano thickness having good uniformity on the surfaces of the nanoparticles having a three-dimensional structure. A plurality of reactive gases serving as a source of the shell material needed for the thin film deposition can be supplied by turns.

The nanoparticle coating unit 200 includes the coating chamber 220 in which a coating process of the nanoparticles is substantially performed, a first gas supply valve 221 configured to supply a carrier gas, a second gas supply valve 222 configured to supply a reactive gas serving as a source of the shell material, a vacuum pump 223 installed at one side of the coating chamber 220, and a speed adjustment member 230 installed in the coating chamber 220.

The carrier gas supplied through the first gas supply valve 221 is an inert gas, and the reactive gas supplied through the second gas supply valve 222 is a first precursor and a second precursor for forming a shell material of a thin film. The second gas supply valve 222 is connected to a precursor supply source (not shown) configured to supply the first precursor and the second precursor such that the first and second precursors can be alternately supplied by opening a first flow path configured to supply one precursor and closing a second flow path configured to supply the other precursor to selectively supply only the first precursor of the two precursors, and on the other hand, by closing the first flow path and opening the second flow path to selectively supply the second precursor only. Here, the carrier gas, which is Ar serving as an inert gas, is supplied from the first gas supply valve 221, and when an aluminum oxide ($Al_2O_3$) thin film is coated as the shell material, TMA (trimethylaluminum), which is the first precursor serving as an aluminum source, and $H_2O$, which is the second precursor serving as an oxygen source, can be alternately supplied from the second gas supply valve 222.

When the valve 210 is opened and the vacuum pump 223 is operated, the generated nanoparticles are introduced into the coating chamber 220 to move along the process passage in one direction, and at this time, the carrier gas and the reactive gas can be supplied into the coating chamber 220.

The first precursor and the second precursor serving as the reactive gas should be moved to overtake the foregoing nanoparticles in order to perform thin film coating of the shell material through the atomic layer deposition. Since the thin film is gradually thickened as the shell material is deposited by the reaction of the first and second precursors, the reactive gas should be relatively rapidly moved to secure a certain coating thickness while reducing the moving speed of the nanoparticles. That is, when the first precursor more rapidly moves than the nanoparticles introduced into the process passage to come in contact with the surface of the three-dimensional nanoparticle and the second precursor supplied thereafter more rapidly moves than the nanoparticle to come in contact with the surface of the three-dimensional nanoparticle, the thin film coating of the shell material by the reaction between the first precursor and the second precursor can be performed.

As described above, in order to adjust the moving speed of the nanoparticles and the reactive gas, the speed adjustment member 230 is installed at the process passage of the coating chamber 220.

A plurality of speed adjustment members 230 may be installed in a longitudinal direction of the process passage at predetermined intervals, and may be formed of a porous material or in a grid structure. The speed adjustment member 230 has fine holes through which the nanoparticles having a certain volume can pass, and the fine hole has a nano size such that the moving speed of the moving nanoparticles can be reduced due to a flow resistance or collision while the nanoparticles pass through the speed adjustment member 230.

Since the carrier gas or the reactive gas has a relatively small volume, the carrier gas or the reactive gas moves through the speed adjustment member 230 with less resistance. Accordingly, the moving speed of the first precursor and the second precursor serving as the reactive gas conveyed by the carrier gas is remarkably larger than the moving speed of the nanoparticles.

Figure 3:
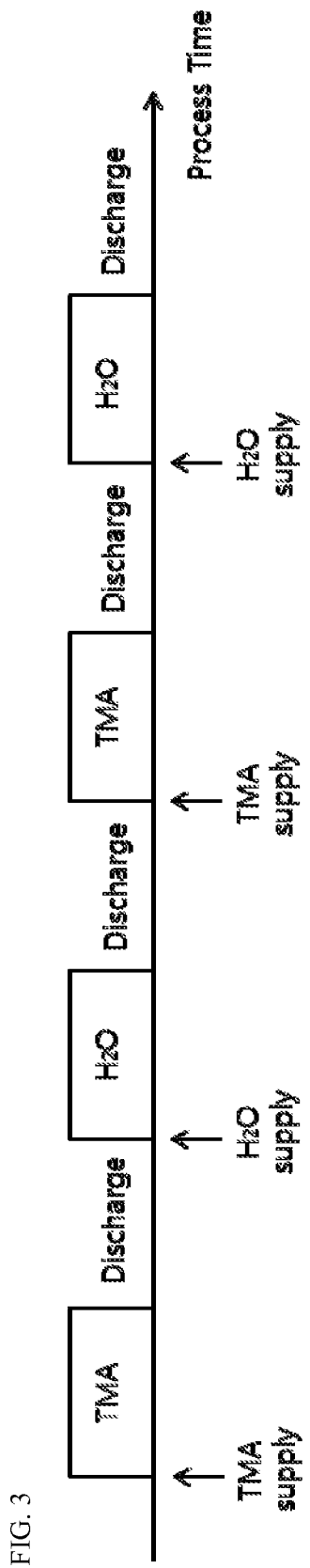
FIG. 3 is a view for describing an operation of supplying a first precursor and a second precursor into a coating chamber of the present invention according to a set period.

A supply period of the reactive gas is set to correspond to the thickness of the coating of the shell material coated on the nanoparticles. As shown in FIG. 3, while TMA (trimethylaluminum), which is the first precursor serving as the aluminum source, and $H_2O$, which is the second precursor serving as the oxygen source, are alternately supplied, whenever one precursor is supplied, supply of the two precursors can be stopped to discharge a reactant or byproduct to the outside of the coating chamber 220. This is in order to exclude irregular deposition due to the reactant or byproduct as well as to allow the nanoparticles to move without being fixed to a specific position.

The shell material of 0.5 to 1 Å can be uniformly coated on the three-dimensional nanoparticles at each coating process of one reaction cycle in which the first and second precursors are alternately supplied, and the nanoparticles having the core-shell structure coated with the shell material in the nanoparticle coating unit 200 are conveyed to the core-shell nanoparticle collecting unit 300.

The core-shell nanoparticle collecting unit 300 includes a cyclone collector 310, an electrostatic collector 320, and a particle collector 330. In the embodiment, while the method of collecting the nanoparticles having the core-shell structure through a multi-step collecting process is applied to maximize a collecting efficiency in the core-shell nanoparticle collecting unit 300, the present invention is not limited thereto and a collector appropriate for an installation environment or a process condition can be selectively applied.

The cyclone collector 310 includes a cylindrical tank 311 connected to the vacuum pump 223 via a connecting pipe 312 installed to be in communication with an upper end thereof. Since the core-shell nanoparticles have a larger mass than that of the carrier gas, the core-shell nanoparticles are introduced into the upper end of the cylindrical tank 311 via the connecting pipe 312 and classified by a centrifugal force to be primarily collected.

The electrostatic collector 320 configured to collect the particles using an electrostatic force is connected to a lower end of the cyclone collector 310.

The electrostatic collector 320 includes an ionization reaction chamber 321 connected to be in communication with a lower end of the cylindrical tank 311, an electrode member constituted by a high voltage electrode 323 and a ground electrode 324 installed at the ionization reaction chamber 321, and an alternating current high voltage supply unit 322 configured to supply an alternating current high voltage to the high voltage electrode 323.

The electrostatic collector 320 can apply a high voltage to the core-shell nanoparticles introduced into the ionization reaction chamber 321 from the lower end of the cylindrical tank 311 to ionize the particle with an anion or a cation, thereby collecting the nanoparticles. Here, the ground electrode 324 includes a plurality of disk-shaped conductive plates formed in an axial direction of a support section 325. A periphery of the conductive plate has a sharp serration shape in order to increase ionization efficiency by the high voltage.

The particle collector 330 can receive the core-shell nanoparticles collected by the electrostatic collector 320 to finally collect and store the nanoparticles.

The particle collector 330 includes a guide pipe 332, a separating container 331, a grid 333, a storage container 334, and a discharge pipe 335. A discharge pump 340 is connected to the separating container 331 through the discharge pipe 335.

One side of the guide pipe 332 passes through the cylindrical tank 311 and extends into the ionization reaction chamber 321, and the other side is connected to an upper end of the separating container 331. The grid 333 is vertically installed in the separating container 331, and a plurality of grids 333 are installed in parallel at predetermined intervals in layers. The grid 333 has a fine hole of a nano size such that the carrier gas and the reactive gas introduced into the ionization reaction chamber 321 through the connecting pipe 312 can be discharged to the discharge pipe 335.

The storage container 334 is installed at a lower end of a center of the separating container 331 to be in communication with the inside thereof, and the core-shell nanoparticles having the moving speed reduced in the process passing through the plurality of grids 333 are gathered and finally collected in the storage container 334. Here, since some of the core-shell nanoparticles may be discharged to exit the discharge pipe 335, the grid 333 near the discharge pipe 335 should have the fine hole having a smaller size than that of the grid 333 near the guide pipe 332. That is, fine holes through which the core-shell nanoparticles having a large volume can pass are formed in the grid 333 near the guide pipe 332. Since the discharge operation of the carrier gas and the reactive gas may be interfered when the fine holes formed in the grid 333 near the discharge pipe 335 are too small, it is preferable to form fine holes having an appropriate size through which the carrier gas and the reactive gas having a smaller volume than that of the core-shell nanoparticles can pass.

Accordingly, the core-shell nanoparticles and the carrier gas ionized and collected in the ionization reaction chamber 321 by the discharge pump 340 are introduced into the separating container 331 through the guide pipe 332, the carrier gas is discharged through the discharge pipe 335, and the core-shell nanoparticles are gathered and finally collected in the storage container 334.

Hereinafter, an in situ method of manufacturing nanoparticles having a core-shell structure of the present invention will be described.

As shown in FIG. 2, the nanoparticle generating unit 100 is connected to the nanoparticle coating unit 200 and the core-shell nanoparticle collecting unit 300 to link the generation of the nanoparticles to the coating and collecting process, continuously processing the nano particles.

First, the low pressure plasma is generated in the reaction chamber 120 using the low pressure plasma generator 140, the fluid supply pump 110 conveys the precursor in the liquid phase serving as a spray sample of the nanoparticles to the electrospray nozzle 141, and the gas supply source 130 supplies the carrier gas and the reactive gas into the reaction chamber 120. Here, Ar may be used as the carrier gas, and $O_2$, $NH_3$, $H_2O$, or the like, may be used as the reactive gas.

The precursor melted in the liquid solvent by the high voltage applied to the reaction chamber 120 forms the nano drops to be sprayed into the reaction chamber 120. The carrier gas (Ar) and the reactive gas ($O_2$, $NH_3$, $H_2O$, or the like) are activated in the reaction chamber 120 by the low pressure plasma (cold plasma) to generate a reactive radical, and the reactive radical reacts with the nano drops to generate nanoparticles. The nanoparticles may be a metal oxide, a metal nitride, or the like. Here, the solvent serving as a medium of the nano drops is vaporized by the plasma to first exit the reaction chamber 120 (400).

The nanoparticles and the carrier gas (Ar), and the reactive gas serving as the source of the shell material are supplied into the process passage of the coating chamber 220 (410).

As the moving speed of the nanoparticles supplied into the process passage of the coating chamber 220 is decreased by the speed adjustment member 230 formed of a porous material or in a grid structure, the carrier gas and the first and second precursors serving as the reactive gas, which is the source of the shell material, supplied into the process passage relatively rapidly move more than the nanoparticles to coat the shell material on the surface of the nanoparticle. That is, when the first precursor more rapidly moves than the nanoparticles introduced into the process passage to come in contact with the surfaces of the three-dimensional nanoparticles and the second precursor supplied thereafter more rapidly moves than the nanoparticles to come in contact with the surfaces of the three-dimensional nanoparticles, the thin film coating of the shell material by the reaction between the first precursor and the second precursor can be performed. Here, when the carrier gas, which is Ar serving as an inert gas, is supplied from the first gas supply valve 221 and the aluminum oxide ($Al_2O_3$) thin film is coated as the shell material, TMA (trimethylaluminum), which is the first precursor serving as the aluminum source, and $H_2O$, which is the second precursor serving as the oxygen source, can be alternately supplied from the second gas supply valve 222.

A supply period of the reactive gas is set to correspond to a coating thickness of the shell material coated on the nanoparticles. As shown in FIG. 3, while TMA (trimethylaluminum), which is the first precursor serving as the aluminum source, and $H_2O$, which is the second precursor serving as the oxygen source, are alternately supplied, whenever one precursor is supplied, the reactant or byproduct generated by stopping supply of the two precursors can be discharged to the outside of the coating chamber 220.

The shell material of 0.5 to 1 Å can be coated on the three-dimensional nanoparticles at each coating process of one reaction cycle in which the first and second precursors are alternately supplied, and the nanoparticles having the core-shell structure coated with the shell material in the nanoparticle coating unit 200 are conveyed to the core-shell nanoparticle collecting unit 300 (420).

The core-shell nanoparticle collecting unit 300 includes the cyclone collector 310, the electrostatic collector 320, and the particle collector 330 to maximize collecting efficiency through a multi-step collecting process.

The core-shell nanoparticles introduced into the upper end of the cylindrical tank 311 are classified using the centrifugal force to be primarily collected in the cyclone collector 310. The electrostatic collector 320 can apply the high voltage to the core-shell nanoparticles introduced into the ionization reaction chamber 321 connected to be in communication with the lower end of the cylindrical tank 311 to be ionized with an anion or a cation and collected. Next, the particle collector 330 can receive the core-shell nanoparticles collected by the electrostatic collector 320 to be finally collected and stored in the storage container 334 using the grid 333. That is, the core-shell nanoparticles and the carrier gas ionized and collected in the ionization reaction chamber 321 are introduced into the separating container 331 through the guide pipe 332, the carrier gas is discharged to the discharge pump 340 connected to the discharge pipe 335, and the core-shell nanoparticles filtered by the grid 333 are gathered and finally collected in the storage container 334 (430).

As can be seen from the foregoing, the in situ system and method of manufacturing the nanoparticles having the core-shell structure according to the present invention can manufacture high purity nanoparticles having good uniformity and increase productivity through a production method appropriate for mass production by linking and continuously processing the manufacture of the nanoparticles and the coating and collecting process.

The present invention can uniformly coat the shell material on the surfaces of the nanoparticles by adjusting the moving speed of the nanoparticles supplied into the coating chamber and the reactive gas serving as the source of the shell material, and easily adjust the thickness of the shell material by controlling the supply period of the reactive gas.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. An in situ system of manufacturing nanoparticles having a core-shell structure, the system comprising:
   a nanoparticle generating unit configured to generate the nanoparticles in a reaction chamber, the nanoparticle generating unit configured to supply a nanoparticle generating carrier gas and a nanoparticle generating reactive gas;
   a nanoparticle coating unit configured to receive the nanoparticles serving as a core material from a process passage of a coating chamber connected to the nanoparticle generating unit, the nanoparticle coating unit configured to supply a nanoparticle coating carrier gas and a nanoparticle coating reactive gas serving as a source of a shell material into the process passage of the coating chamber, the nanoparticle coating reactive gas including a first precursor and a second precursor and each of the first precursor and the second precursor being supplied alternately, and to coat the nanoparticles moving in the process passage of the coating chamber with the shell material in a state in which a vacuum pump is operated;
   and
   a core-shell nanoparticle collecting unit configured to collect the nanoparticles having the core-shell structure coated with the shell material in the nanoparticle coating unit,
   wherein the nanoparticle generating unit, the nanoparticle coating unit, and the core cell nanoparticle collecting unit are connected to link and continuously process generation of the nanoparticles and a coating and collecting process performed by the nanoparticle generating unit; the nanoparticle coating unit, and the core-shell nanoparticle collecting unit, and
   the nanoparticle coating unit has a speed adjustment member installed in the process passage of the coating chamber such that a moving speed of the nanoparticles is decreased and the reactive gas moves to overtake the foregoing nanoparticles, wherein
   a first gas supply valve is configured to supply the nanoparticle coating carrier gas and a second gas supply valve is configured to supply the nanoparticle coating reactive gas serving as a source of the shell material, the nanoparticle coating carrier gas supplied through the first gas supply valve is an inert gas, and the nanoparticle coating reactive gas supplied through the second gas supply valve comprises the first precursor and the second precursor for forming a shell material of a thin film, the second gas supply valve, connected to a precursor supply source, is configured to supply the first precursor and the second precursor such that the first and second precursors can be alternately supplied either by opening a first flow path configured to supply one precursor and closing a second flow path to selectively supply only the first precursor of the two precursors or by closing the first flow path and opening the second flow path to selectively supply the second precursor only, and
   a period for supply the nanoparticle coating reactive gas is set corresponding to 0.5~1 Å thickness of the coating of the shell material coated on the nanoparticles, and
   when the first and second precursor is supplied, supply of the two precursors can be stopped to discharge a reactant or byproduct to the outside of the coating chamber to exclude irregular deposition due to the reactant or byproduct as well as to allow the nanoparticles to move without being fixed to a specific position,
   wherein the speed adjustment member includes nano-sized fine holes through which the nanoparticles having a certain volume can pass and is formed of a porous material or in a grid structure in a longitudinal direction of the process passage at predetermined intervals, the moving speed of the moving nanoparticles is decreased due to a flow resistance or collision when the nanoparticles pass through the nano-sized fine holes of the speed adjustment member, the nanoparticle coating carrier gas and the nanoparticle coating reactive gas has smaller volume compared to the nanoparticles, the nanoparticle coating carrier gas or the nanoparticle coating reactive gas moves through the speed adjustment member with less resistance and wherein the shell material having the thickness 0.5~1 Å can be uniformly coated on the nanoparticles at each coating process of one reaction cycle in which the first precursor and the second precursor is alternately supplied.

2. The in situ system of manufacturing the nanoparticles having the core-shell structure according to claim 1, wherein the nanoparticle coating carrier gas is argon (Ar) serving as an inert gas, and TMA (trimethylaluminum) serving as an aluminum source and $H_2O$ serving as an oxygen source are used as the nanoparticle coating reactive gas when an aluminum oxide ($Al_2O_3$) thin film is coated as the shell material.

3. The in situ system of manufacturing the nanoparticles having the core-shell structure according to claim 1, wherein the nanoparticle generating unit comprises a fluid supply pump configured to supply a precursor in a liquid phase serving as a spray sample of the nanoparticles, a gas supply source configured to supply the nanoparticle generating carrier gas and the nanoparticle generating reactive gas into the reaction chamber, and a low temperature plasma generator configured to generate low temperature plasma according to a radio frequency inductively coupled plasma (ICF) method.

4. The in situ system of manufacturing the nanoparticles having the core-shell structure according to claim 3, wherein the low temperature plasma generator comprises an RF matching box configured to match impedance of the reaction chamber using a direct current high voltage supply unit, an electrospray nozzle, wherein a radio frequency is generated in an induction coil surrounding the reaction chamber.

5. The in situ system of manufacturing the nanoparticles having the core-shell structure according to claim 1, wherein the core-shell nanoparticle collecting unit comprises one of a cyclone collector, an electrostatic collector, or a particle collector.

6. The in situ system of manufacturing the nanoparticles having the core-shell structure according to claim 5, when the core-shell nanoparticle collecting unit is the electrostatic collector, wherein the electrostatic collector comprises an electrode member constituted by a high voltage electrode installed at a collecting container and a ground electrode, and an alternating current high voltage supply unit configured to supply an alternating current high voltage to the high voltage electrode, and the ground electrode comprises a plurality of disk-shaped conductive plates installed in an axial direction of a support section, and a periphery of the conductive plate has a sharp serration shape.

7. The in situ system of manufacturing the nanoparticles having the core-shell structure according to claim 6, when the core-shell nanoparticle collecting unit is the particle collector, wherein the particle collector comprises a separating container connected to the electrostatic collector, a storage container installed to be in communication with the separating container and configured to finally collect and store the core-shell nanoparticles, and a plurality of grids installed in the separating container to guide the nanoparticles having the core-shell structure to the storage container.

* * * * *